United States Patent
Kim

(10) Patent No.: US 7,514,955 B2
(45) Date of Patent: Apr. 7, 2009

(54) SEMICONDUCTOR MEMORY DEVICE WITH ABILITY TO EFFECTIVELY ADJUST OPERATION TIME FOR ON-DIE TERMINATION

(75) Inventor: Kyung-Whan Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/819,797

(22) Filed: Jun. 29, 2007

(65) Prior Publication Data
US 2008/0164904 A1 Jul. 10, 2008

(30) Foreign Application Priority Data
Jan. 10, 2007 (KR) .............. 10-2007-0002893

(51) Int. Cl.
*H03K 19/003* (2006.01)
(52) U.S. Cl. .................. 326/30; 326/29
(58) Field of Classification Search ............. 326/26, 326/30, 81–83, 86–87; 327/108–109
See application file for complete search history.

(56) References Cited

U.S. PATENT DOCUMENTS

| | | | | |
|---|---|---|---|---|
| 5,838,177 | A * | 11/1998 | Keeth | 327/108 |
| 6,801,969 | B2 * | 10/2004 | Crafts et al. | 710/100 |
| 6,958,613 | B2 | 10/2005 | Braun et al. | |
| 6,980,020 | B2 | 12/2005 | Best et al. | |
| 7,151,390 | B2 | 12/2006 | Nguyen et al. | |
| 7,170,313 | B2 | 1/2007 | Shin | |
| 7,176,711 | B2 * | 2/2007 | Park et al. | 326/30 |
| 7,176,729 | B2 * | 2/2007 | Hayashi et al. | 327/108 |
| 7,342,412 | B2 * | 3/2008 | Kim | 326/30 |
| 2006/0255829 | A1 * | 11/2006 | Kim et al. | 326/30 |

FOREIGN PATENT DOCUMENTS

| | | |
|---|---|---|
| JP | 09-251057 | 9/1997 |
| JP | 2005-285125 | 10/2005 |
| JP | 2006-129423 | 5/2006 |
| KR | 10-20050108759 | 11/2005 |

OTHER PUBLICATIONS

Korean Notice of Allowance, issued in Korean Patent Application No. KR 10-2007-0002893 dated on Aug. 27, 2008.

* cited by examiner

*Primary Examiner*—Rexford Barnie
*Assistant Examiner*—Christopher Lo
(74) *Attorney, Agent, or Firm*—McDermott Will & Emery LLP

(57) ABSTRACT

A semiconductor memory device is effectively able to adjust operation time for on-die termination (ODT). The semiconductor memory device includes a latency control unit, a control signal generating unit, a trimming control unit, and a termination circuit. The latency control unit produces an ODT driving enable signal by delaying an ODT operation signal from an external circuit during a predetermined latency. The control signal generating unit produces control signals to control a change of waveform of the ODT driving enable signal. The trimming control unit changes the waveform of the ODT driving enable signal in response to the control signals, thereby outputting a ODT driving signal. The termination circuit connects a termination resistance to an impedance adjusting node in response to the ODT driving signal.

47 Claims, 8 Drawing Sheets

FIG. 1

< ODT turn-on, turn-off Latency in Synchronous mode >

| Symbol | Parameter | DDR3 - 800 | DDR3 - 1066 | DDR3 - 1333 | DDR3 - 1600 | Unit |
|---|---|---|---|---|---|---|
| ODTLon | ODT turn on latency | WL-2.0 = CWL + AL - 2.0 | | | | tCK |
| ODTLoff | ODT turn off latency | WL-2.0 = CWL + AL - 2.0 | | | | |

FIG. 3

< ODT AC Timing Parameters >

| AC CHARACTERISTICS | | DDR3 - 800 | | DDR3 - 1066 | | DDR3 - 1333 | | DDR3 - 1600 | | Unit |
|---|---|---|---|---|---|---|---|---|---|---|
| PARAMETER | Symbol | MIN | MAX | MIN | MAX | MIN | MAX | MIN | MAX | |
| RTT_NOM turn-on time from ODTon reference | tAON | -400 | 400 | -300 | 300 | -250 | 250 | -225 | 225 | ps |
| RTT_NOM turn-off time from ODToff reference | tAOF | 0.3 | 0.7 | 0.3 | 0.7 | 0.3 | 0.7 | 0.3 | 0.7 | tCK(avg) |
| RTT_NOM and RTT_WR change skew | tADC | 0.3 | 0.7 | 0.3 | 0.7 | 0.3 | 0.7 | 0.3 | 0.7 | tCK(avg) |

⟨ Testmode Table for ODT timing parameter control ⟩

| TM1 | TM0 | S0 | S1 | S2 | S3 | ACTION |
|---|---|---|---|---|---|---|
| 0 | 0 | 1 | 0 | 0 | 0 | NO Operation |
| 0 | 1 | 0 | 1 | 0 | 0 | delay by unit delay time (Tunit) |
| 1 | 0 | 0 | 0 | 1 | 0 | delay by 2xTunit |
| 1 | 1 | 0 | 0 | 0 | 1 | delay by 3xTunit |

| TM3 | TM2 | C0 | C1 | C2 | C3 | ACTION |
|---|---|---|---|---|---|---|
| 0 | 0 | 1 | 0 | 0 | 0 | NO Operation |
| 0 | 1 | 0 | 1 | 0 | 0 | delay by unit section time (ESL) |
| 1 | 0 | 0 | 0 | 1 | 0 | pulse width increment by unit section (ESR1) |
| 1 | 1 | 0 | 0 | 0 | 1 | pulse width increment by twice of unit section (ESR2) |

SEMICONDUCTOR MEMORY DEVICE WITH ABILITY TO EFFECTIVELY ADJUST OPERATION TIME FOR ON-DIE TERMINATION

CROSS-REFERENCE TO RELATED APPLICATIONS

The present invention claims priority of Korean patent application no. 10-2007-0002893, filed in the Korean Patent Office on Jan. 10, 2007, which is incorporated by reference in its entirety.

BACKGROUND OF THE INVENTION

The present invention relates to a semiconductor memory device; and, more particularly, to a circuit performing an ODT (on-die termination) operation in a semiconductor memory device.

In a system having different semiconductor devices which perform various functions, a semiconductor memory device is used as an apparatus for storing data. The semiconductor memory device outputs data, which are correspondent to address inputted from data processing unit to request for the data, for example, a central processing unit and stores in a unit cell the data which are delivered from the data processing unit based on the corresponding address.

As the operation speed of the system becomes higher, the data input/output speed which is required in the data processing unit of the system requests is enhanced more and more. However, in the development of the semiconductor IC until recent date, the data input/output speed between the data processing unit and the semiconductor memory device does not follow the operation speed required within the data processing unit.

Different semiconductor memory devices have been developed in order to increase the data input/output speed to a degree which the data processing unit requires. Synchronous memory devices, which output data in synchronization with the system clock signals provided from the data processing unit, are introduced recently. The synchronous memory device receiving the system clock signal outputs the data to the data processing unit based on a time period of the system clock signal and also receives the data from the data processing unit based on a time period of the system clock signal. However, since this synchronous memory device is not still sufficient for the operation speed of the data processing unit, DDR synchronous memory devices have been developed these days. In DDR synchronous memory devices, the data input and output are carried out based on the transition of the system clock signal. That is, the data input and output of the DDR synchronous memory devices are executed in response to the rising edge and the falling edge of the system clock signal.

On the other hand, various methods for inputting/outputting the data in a high speed between the data processing unit and the semiconductor memory device have been developed. In particular, the data input/output speed between the data processing unit and the semiconductor memory device is increased by controlling impedance on input/output pads through which the data of the semiconductor memory device are inputted and outputted. In the most common technique of the impedance control in the semiconductor memory device, a termination resistance is connected to a node into which data are inputted and the node is to be impedance-controlled to increase the high rate data transmission in the semiconductor memory device.

The termination resistance had been disposed on the PCB (printed circuit board) on which the semiconductor memory device is mounted; however, these semiconductor memory device has the termination resistance within its own inner circuit. The termination resistance included in the semiconductor memory device is called "On-die Termination." Also, a control signal, which controls the termination resistance included in the semiconductor memory device, is provided from an external circuit. ODT technique is to dispose the termination resistance in the semiconductor memory device. That is, the ODT technique is to make the data transmission fast by connecting the termination resistance to a data receiving side in transferring the data between the data processing unit and the semiconductor memory device. Particularly, this ODT technique is useful in a graphic memory required to transfer the data in a high speed.

FIG. 1 is a table showing an ODT operation time based on the JEDEC specification, particularly the ODT operation time described in the DDR3 specification. FIG. 2 is a waveform illustrating an ODT operation shown in FIG. 1. Since the semiconductor memory device manufactured in compliance with the DDR2 specification typically has the clock frequency of 533 MHz or 667 MHz, there is no a burden on the clock timing parameter relatively. However, since the semiconductor memory device based on the high-speed DDR3 specification has the clock frequency of 800 MHz, 1066 MHz, 1333 MHz or 1600 MHz, it is more difficult to develop a semiconductor memory device in which the ODT timing parameter complies with the specification. As shown in FIG. 1, a point of time of an activation and inactivation of the ODT operation is determined by the following equation: WL−2.0=CWL+AL−2.0.

An issue on the ODT timing becomes important more and more. The ODT operation is classified into a synchronous mode and an asynchronous mode. In actual operation, this is recognized by a power down of a memory device or by an activation of a delay locked loop. The asynchronous mode is easy to satisfy the DDR3 specification because a time which it takes to turn on and off the ODT circuit is one of 1 to 9 ns. However, since the semiconductor memory device in the synchronous mode should operate in synchronization with the clock signals, it is not easy to implement the synchronous semiconductor memory device. Thereafter, the synchronous semiconductor memory devices will be illustrated.

FIG. 2 is a timing chart of a synchronous ODT operation. Referring to FIG. 1, when an ODT operation signal ODT from an externals circuit is activated into a semiconductor memory device in a high level, a termination resistance is connected to an ODT node, of which the impedance is to be controlled, after a lapse of clock time by CWL+AL−2.0. The ODT node is a node to which data input/output pads are connected in order to receive the data from an external circuit. Also, when the ODT operation signal ODT is inactivated to a low level, the termination resistance is disconnected to the ODT node after a lapse of clock time by CWL+AL−2.0. Here, CWL is a column address strobe (CAS) latency. That is, CWL means a time which it takes to start the data storage into the semiconductor memory device after a write command has been executed. AL is an active latency and this means a time which it takes to execute the actual write operation after a point of time the write command is inputted. FIG. 2 is a timing chart in the case where AL is 3 and CWL is 5. That is, the termination resistance is connected to the ODT node after six clock signals from the activation of the ODT operation signal ODT. When the ODT operation signal ODT is inactivated, the termination resistance is disconnected to the ODT node after six clock signals. Eventually, the termination resistance is connected to the ODT node faster than the data input by two clock signals. An inner ODT operation signal IntODT is created when the ODT operation signal ODT is inputted into the semiconductor memory device.

The ODT operation timing, i.e., the time the termination resistance is connected to the ODT node, is in compliance with the range prescribed in the specification and tAONmin, tAONmax, tAOFmin and tAOFmax are correspondent to the parameters of the ODT timing. The tAONmin parameter is a value taken by measuring a time in a direction of (−) centering a reference clock signal which is set up by the ODT latency ODTLon and the tAONmax parameter is a value taken by measuring a time in a direction of (+) centering a reference clock signal which is set up by the ODT latency ODTLon. The tAOFmin parameter is a smallest one of values taken by measuring a time in a direction of (+) centering a reference clock signal which is set up by the ODT turn-off latency ODTLoff and the tAOFmax parameter is a largest one of values taken by measuring a time in a direction of (+) centering a reference clock signal which is set up by the ODT turn-off latency ODTLoff.

Meanwhile, the dynamic ODT operation is further introduced in the DDR3 specification. When a write command is inputted after the termination resistance is connected to the ODT node by the ODT operation, the termination resistance is disconnected from the ODT node at the time of the write operation and an additional termination resistance is connected to the ODT node by the dynamic ODT operation. Accordingly, in order to make the dynamic ODT operation satisfy the specification, a timing required to change the termination resistance connected to the ODT mode into the write termination resistance should be appropriately controlled. The reason why the dynamic ODT operation is further added is that different ODT operations can be executed on a module on which the semiconductor memory devices manufactured according to the specification are disposed. For example, the semiconductor memory devices, which are disposed on the module, can be classified into ranks and the termination operation is carried out in the semiconductor memory device within the adjacent rank when the data are accessed in a selected rank. For the dynamic ODT operation, the module is classified into four ranks.

In addition, there are dynamic ODT timing parameters such as tADCmin and tADCmax. In the case where the dynamic ODT function is supported, the tADCmin parameter is the smallest one of values taken by measuring a time in a direction of (+) centering a reference clock signal which is set up by the dynamic ODT turn-on latency ODTLcnw and the tADCmax parameter is the largest one of values taken by measuring a time in a direction of (+), centering a reference clock signal which is set up by the dynamic ODT turn-on latency ODTLcnw.

FIG. 3 is a table showing an ODT AC parameters based on the JEDEC specification. The parameter tAON is in a range of ±225 ps to ±400 ps according to the operation speed. The parameters of tAOF and tADC are in a range of 0.3 tCK to 0.7 tCK. That is, in the case of tAON, tAOF and tADC parameters, the shorter the clock time tCK is, the more it is difficult to satisfy the specification.

The fluctuation of the ODT operation characteristics may be serious according to the processes of the semiconductor memory devices and it may be required to adjust the ODT timing whenever the semiconductor memory devices are manufactured.

Accordingly, a method for effectively adjusting the ODT timing is needed. Particularly, in the case of the high-speed semiconductor memory device, different testing methods capable of adjusting the ODT timing is also needed to cope with the fluctuation of the ODT operation characteristics.

SUMMARY OF THE INVENTION

Embodiments of the present invention are directed to provide a semiconductor memory device with ability to effectively adjust operation time for on-die termination (ODT).

In accordance with an aspect of the present invention, a semiconductor memory device includes a latency control unit for producing an ODT driving enable signal by delaying an ODT operation signal from an external circuit during a predetermined latency, a control signal generating unit for producing control signals to control a change of waveform of the ODT driving enable signal, a trimming control unit for changing the waveform of the ODT driving enable signal in response to the control signals, thereby outputting a ODT driving signal, and a termination circuit for connecting a termination resistance to an impedance adjusting node in response to the ODT driving signal.

In accordance with another aspect of the present invention, a semiconductor memory device includes a first latency control unit for producing a normal ODT driving enable signal by delaying an ODT operation signal from an external circuit during a first latency, a second latency control unit for producing a write ODT driving enable signal by delaying a write command signal, which is produced in response to a write command, during a second latency, a control signal generating unit for producing control signals to control a change of waveform of the ODT driving enable signal, a first trimming control unit for changing the waveform of the normal ODT driving enable signal in response to the control signals, thereby outputting a normal ODT driving signal, a second trimming control unit for changing the waveform of the write ODT driving enable signal in response to the control signals, thereby outputting a write ODT driving signal, and a termination circuit for connecting a normal termination resistance to an impedance adjusting node in response to the normal ODT driving signal and for disconnecting the normal termination resistance from the impedance adjusting node and connecting a write termination resistance to the impedance adjusting node in response to the write ODT driving signal.

In accordance with further aspect of the present invention, a semiconductor memory device includes a latency control unit for producing an ODT driving enable signal by delaying an ODT operation signal from an external circuit during a predetermined latency, an ODT signal delay unit for delaying the ODT driving enable signal by an amount of delay which is correspondent to control signals, a pulse width adjusting unit for changing waveform of the delayed ODT driving enable signal from the ODT signal delay unit, thereby outputting the ODT driving signal, and a termination circuit for connecting a termination resistance to an impedance adjusting node in response to the ODT driving signal.

In accordance with further aspect of the present invention, a semiconductor memory device includes a first latency control unit for producing a normal ODT driving enable signal by delaying an ODT operation signal from an external circuit during a first latency, a second latency control unit for producing a write ODT driving enable signal by delaying a write command signal, which is produced in response to a write command, during a second latency, a normal ODT signal delay unit for delaying the normal ODT driving enable signal by an amount of delay which is correspondent to control signals, a normal pulse width adjusting unit for changing a pulse width of the delayed normal ODT driving enable signal from the normal ODT signal delay unit, thereby outputting a normal ODT driving signal, a write ODT signal delay unit for delaying the write ODT driving enable signal by an amount of delay which is correspondent to control signals, a write pulse width adjusting unit for changing a pulse width of the delayed write ODT driving enable signal from the write ODT signal delay unit, thereby outputting a write ODT driving signal, and a termination circuit for connecting a normal termination resistance to an impedance adjusting node in response to the normal ODT driving signal and for disconnecting the normal termination resistance from the impedance adjusting node and connecting a write termination resistance to the impedance adjusting node in response to the write ODT driving signal.

In accordance with further aspect of the present invention, a method for driving a semiconductor memory device includes producing an ODT driving enable signal by delaying an ODT operation signal from an external circuit during a predetermined latency, producing control signals to control a change of waveform of the ODT driving enable signal, changing the waveform of the ODT driving enable signal in response to the control signals, thereby outputting a ODT driving signal, and connecting a termination resistance to an impedance adjusting node in response to the ODT driving signal.

In accordance with further aspect of the present invention, a method for driving a semiconductor memory device includes producing a normal ODT driving enable signal by delaying an ODT operation signal from an external circuit during a first latency, producing a write ODT driving enable signal by delaying a write command signal, which is produced in response to a write command, during a second latency, producing control signals to control a change of waveform of the ODT driving enable signal, changing the waveform of the normal ODT driving enable signal in response to the control signals, thereby outputting a normal ODT driving signal, changing the waveform of the write ODT driving enable signal in response to the control signals, thereby outputting a write ODT driving signal, connecting a normal termination resistance to an impedance adjusting node in response to the normal ODT driving signal, and disconnecting the normal termination resistance from the impedance adjusting node and connecting a write termination resistance to the impedance adjusting node in response to the write ODT driving signal.

BRIEF DESCRIPTION OF THE DRAWINGS

FIG. 1 is a table showing an ODT operation time based on the JEDEC specification.

FIG. 3 is a table showing an ODT AC parameters based on the JEDEC specification.

DESCRIPTION OF SPECIFIC EMBODIMENTS

Hereinafter, a semiconductor memory device in accordance with the present invention will be described in detail referring to the accompanying drawings.

Figure 2:
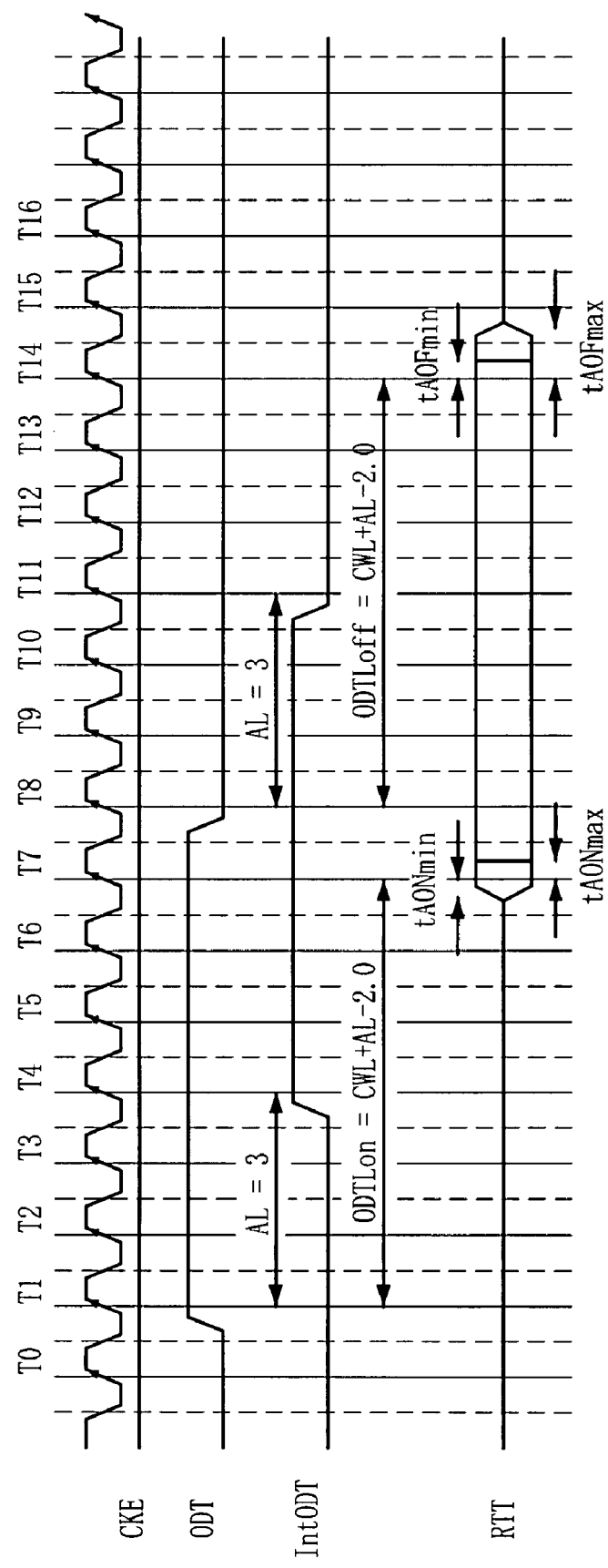
FIG. 2 is a waveform illustrating an ODT operation shown in FIG. 1.
Figure 4:
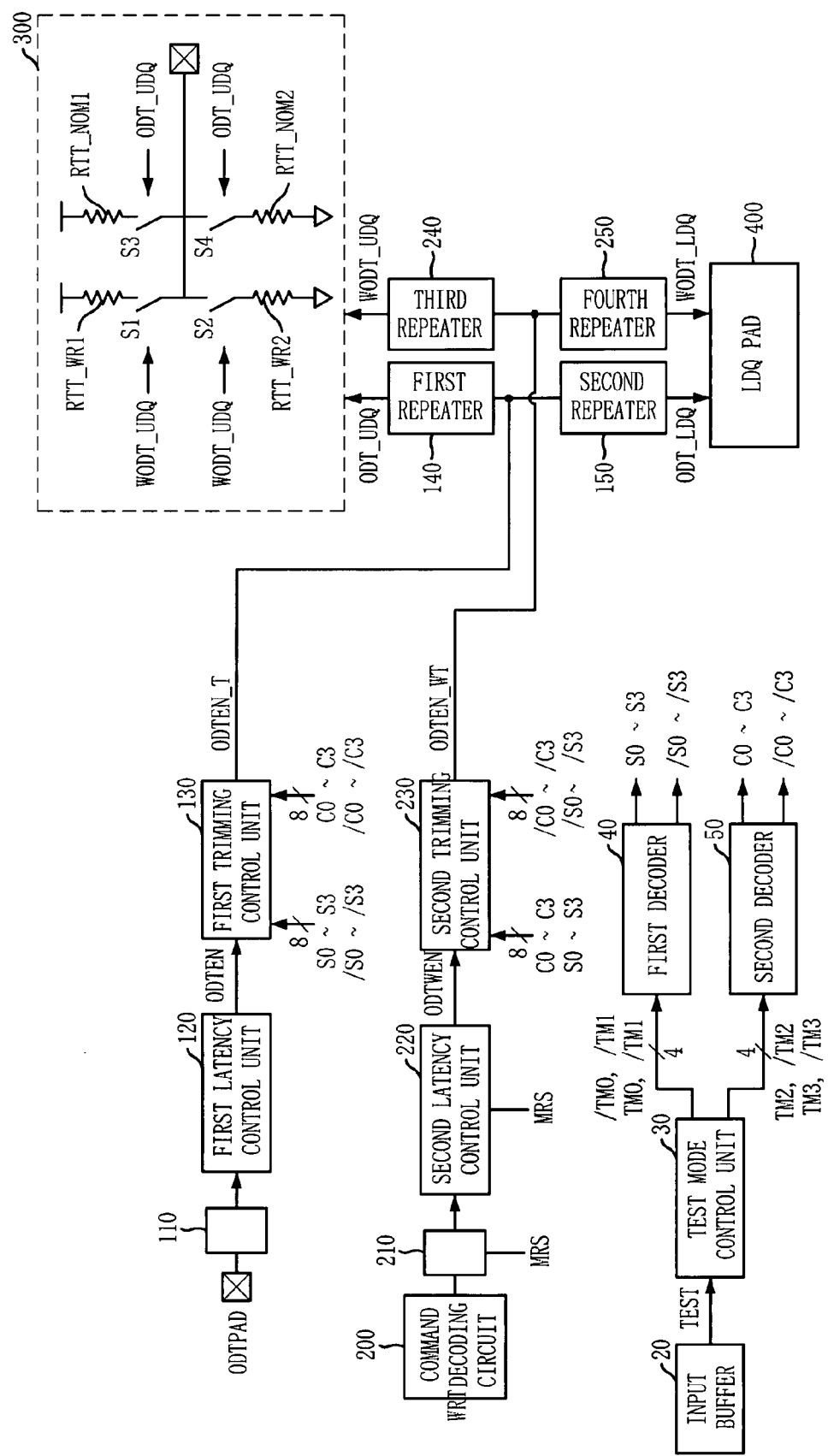
FIG. 4 is a block diagram illustrating a semiconductor memory device according to one embodiment of the present invention.

FIG. 4 is a block diagram illustrating a semiconductor memory device according to one embodiment of the present invention. Referring to FIG. 4, the semiconductor memory device according to one embodiment of the present invention includes an ODT command input buffer 110 associated with ODT operations, a first latency control unit 120, a first trimming control unit 130, a first repeater 140, a second repeater 150, a command decoding circuit 200 associated with a dynamic ODT operations, a write command input buffer 210, a second latency control unit 220, a second trimming control unit 230, a third repeater 240 and a fourth repeater 250. Also, the semiconductor memory device includes a UDQ pad region 300 and a LDQ pad region 400. Further, the semiconductor memory device includes an input buffer 20, a test mode control unit 30, a first decoder 40 and a second decoder 50 for producing control signals to control the first and second trimming control units 130 and 230.

The ODT command input buffer 110 receives an ODT command from an external circuit via an ODT command input buffer ODT PAD and outputs it to the first latency control unit 120. The first latency control unit 120 produces a normal ODT driving enable signal ODTEN by delaying an ODT operation signal, which is provided from the ODT command input buffer 110, during the first latency. The first latency means a period of time which is predetermined in order to execute the ODT operation after the ODT command is inputted into the semiconductor memory device. Also, the normal ODT driving enable signal ODTEN from the first latency-control unit 120 is outputted in synchronization with a delay-locked clock signal which provided from a delay locked loop. The delay-locked clock signal is an internal clock signal which is produced in the semiconductor memory device to correct the transition time of a clock signal which is inputted from an external circuit into the semiconductor memory device and the data output time. The first trimming control unit 130 changes the waveform of the normal ODT driving enable signal ODTEN in response to the control signals S0 to S3, /S0 to /S3, C0 to C3 and /C0 to /C3 and then outputs a trimmed normal ODT driving enable signal ODTEN_T which is changed in the waveform. The first repeater 140 compensates for attenuation of a signal while the trimmed normal ODT driving enable signal ODTEN_T is transmitted to the UDQ pad region 300. The second repeater 150 also compensates for attenuation of a signal while the trimmed normal ODT driving enable signal ODTEN_T is transmitted to the LDQ pad region 400.

The write command input buffer 210 receives a write command WRT which is produced in the command decoding circuit 200 and outputs it to the second latency control unit 220. The second latency control unit 220 outputs a write ODT driving enable signal ODTWEN by delaying a write operation signal, which is provided from the write command input buffer 210, during a second latency. The second latency means a period of time which is predetermined in order to execute the dynamic ODT operation after the write command WRT is inputted into the semiconductor memory device. Also, the write ODT driving enable signal ODTWEN from the second latency control unit 220 is outputted in synchronization with a delay-locked clock signal which provided from the delay locked loop. The first latency and the second latency can have the same value and they can have a different value based on a corresponding operation. The second trimming control unit 230 changes the waveform of the write ODT driving enable signal ODTWEN in response to the control signals S0 to S3, /S0 to /S3, C0 to C3 and /C0 to /C3 and then outputs a trimmed-write ODT driving enable signal ODTEN_WT which is changed in the waveform. The third repeater 240 compensates for attenuation of a signal while the trimmed write ODT driving enable signal ODTEN_WT is transmitted to the UDQ pad region 300. The fourth repeater 250 also compensates for attenuation of a signal while the trimmed write ODT driving enable signal ODTEN_WT is transmitted to the LDQ pad region 400.

Here, the UDQ pad region 300 and the LDQ pad region 400 are areas in which input and output pads of the semiconductor memory device are disposed. The input and output pads of the semiconductor memory device are respectively grouped into an upper portion and a lower portion and the UDQ pad region 300 and the LDQ pad region 400 are correspondent to the input and output pads in the upper portion and the lower portion, respectively. Normal termination resistances RTT_NOM1 and RTT_NOM2 for the ODT operation and write termination resistances RTT_WR1 and RTT_WR2 for the dynamic ODT operation are selectively connected to the input and output pads, which are respectively disposed in the UDQ pad region 300 and the LDQ pad region 400, using switches.

For example, in UDQ pad region 300, four switches S1 to S4 are disposed in the ODT node to which the data input/output (I/O) pads are connected and the normal termination resistances RTT_NOM1 and RTT_NOM2 and the write termination resistances RTT_WR1 and RTT_WR2 are connected to the data I/O pads via the switches.

When the normal ODT driving enable signal ODTEN is activated, the trimming control unit 130 changes the waveform of the normal ODT driving enable signal ODTEN in response to the control signals S0 to S3, /S0 to /S3, C0 to C3 and /C0 to /C3 and then outputs the trimmed normal ODT driving enable signal ODTEN_T. The change of the waveform is to increase or decrease the pulse width of a signal or to shift the signal right or left. When an output signal ODT_UDQ of the first repeater 140 is activated by the trimmed normal ODT driving enable signal ODTEN_T, the switches S3 and S4 are turned on and the normal termination resistances RTT_NOM1 and RTT_NOM2 are connected to the ODT node for the impedance control. Thereafter, when the write ODT driving enable signal ODTWEN is activated and outputted by the second latency control unit 220 based on the dynamic ODT operation, the second trimming control unit 230 outputs, the trimmed write ODT driving enable signal ODTEN_WT in response to the control signals S0 to S3, /S0 to /S3, C0 to C3 and /C0 to /C3. If an output signal WODT_UDQ of the second repeater 240 is activated and outputted in response to the trimmed write ODT driving enable signal ODTEN_WT, the normal termination resistances RTT_NOM1 and RTT_NOM2 are disconnected from the ODT node and the write termination resistances RTT_WR1 and RTT_WR2 are connected to the ODT node.

The signal input buffer 20 receives a test signal TEST from the external circuit and transfers it to the test mode control unit 30. Typically, in the semiconductor memory device, the test signal in the test mode is inputted through a path on which an address signal is inputted. In this case, the signal input buffer 20 may be an address input buffer. In the case where the test signal is inputted on the data input path, the signal input buffer 20 may be a data input buffer. Also, if the test signal is inputted on a separate path, the signal input buffer 20 may be a test signal input buffer. The test mode control unit 30 produces a plurality of test mode signals TM0 to TM3 and /TM0 to /TM3 using the test signal TEST. The first decoder 40 produces the control signals S0 to S3 and /S0 to /S3 by decoding test mode signals TM0, TM1, /TM0 and /TM1. Similarly, the second decoder 50 produces the control signals C0 to C3 and /C0 to /C3 by decoding test mode signals TM2, TM3, /TM2 and /TM3.

In the present invention, the timing parameters of the on-die termination function applied in the DDR3 SDRAM are adjusted by the test mode. The first latency control unit 120 produces the normal ODT driving enable signal ODTEN by delaying the ODT command during a latency which is set up from an input time of the ODT command from the external circuit to the normal ODT operation. The second latency control unit 220 produces the write ODT driving enable signal ODTWEN by delaying the ODT command during a latency which is set up from the generation of the write command, which is internally produced by a command of the external circuit, to the dynamic ODT operation. The first and second latency control units 120 and 220 output their output signals in synchronization with the delay-locked clock signal from the delay locked loop.

However, as mentioned above, even though the first and second latency control units 120 and 220 produce the signals for executing the ODT operation and output the signals to the pad region having the termination resistance by controlling the latency prescribed in the specification, the termination resistance is not connected to the ODT node with the most preferable timing. The output signals of the first and second latency control units 120 and 220 may be fluctuated by the variation of processes in manufacturing the semiconductor memory device and the operating temperature thereof and the signal transmitting time to the pad region, in which the termination resistance is disposed, can be varied or distorted.

To overcome this problem, the present invention includes the first and second trimming control units capable of adjusting, somewhat, the waveform the output signals from the first and second latency control units 120 and 220. The first and second trimming control units adjust the waveform the output signals from the first and second latency control units 120 and 220 in response to control signals which are created by a test signal which comes from the external circuit in the test mode.

After the timing adjustment mentioned above, the signals are transferred to the LDQ pad region 300 and the UDQ pad region using 400 through two repeaters. Data I/O pads used for X8 and X4 mode conditions are disposed in the LDQ pad region 300 and the UDQ pad region using 400 has the additional data I/O pads which are required for X16 mode condition. The first to fourth repeaters 140, 150, 240 and 250 are preferably disposed in the middle between the LDQ pad region 300 and the UDQ pad region using 400 for minimizing the mismatch of the signals passing through the repeaters.

Figures 5, 6:
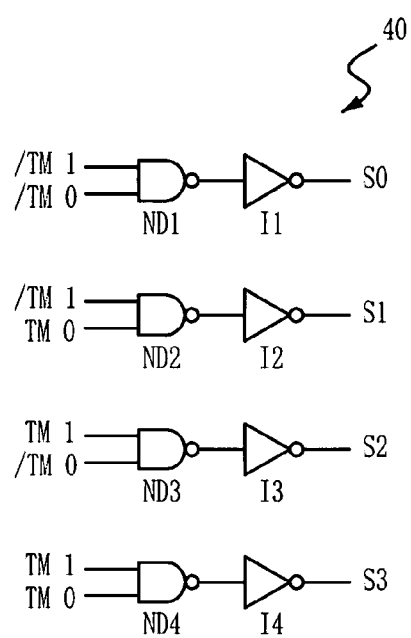
FIG. 5 is a table showing the operation in the test mode of the semiconductor memory device.
FIG. 6 is a block diagram illustrating the first decoder in FIG. 4.

FIG. 5 is a table showing the operation in the test mode of the semiconductor memory device. The semiconductor memory devices are designed by a developer so that different test modes to be required in the semiconductor memory devices are available. FIG. 5 illustrates how to use the different test modes. There are eight modes and the control of the first and second trimming control units 130 and 230 are determined based on the status of test mode signals TM0 to TM3.

Figure 7:
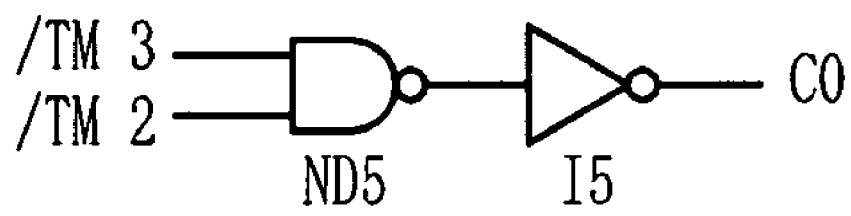
FIG. 7 is a block diagram illustrating the second decoder in FIG. 4.
Figure 7:
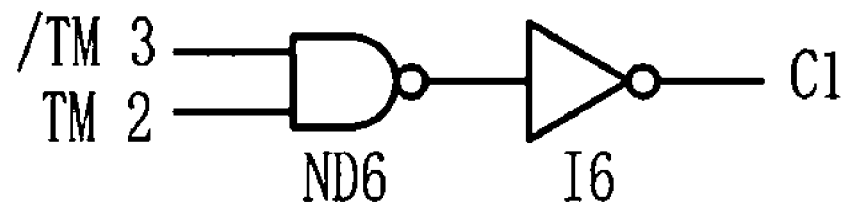
Figure 7:
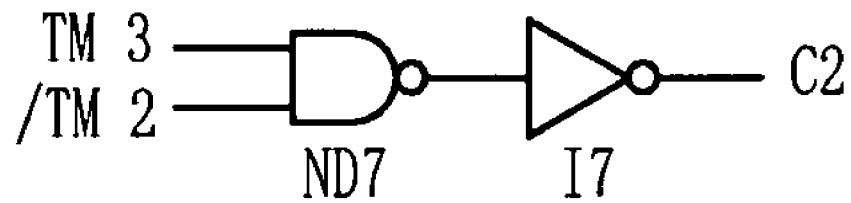
Figure 7:
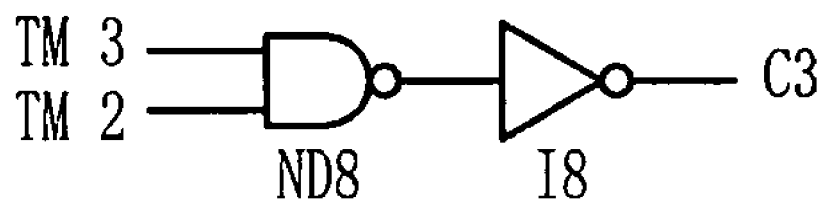

FIG. 6 is a block diagram illustrating the first decoder in FIG. 4. Referring to FIG. 6, the first decoder 40 produces the control signals S0 to S3 and /S0 to /S3 by decoding the test mode signals TM0 and TM1 and inverted signals thereof. FIG. 7 is a block diagram illustrating the second decoder in FIG. 4. In FIG. 6, an inverter to produce inverted signals /S0 to /S3 is omitted. The second decoder 50 produces the control signals C0 to C3 and /C0 to /C3 by decoding the test mode signals TM2 and TM3 and inverted signals thereof. Also, an inverter to produce inverted signals /C0 to /C3 is omitted in FIG. 7.

Figure 8:
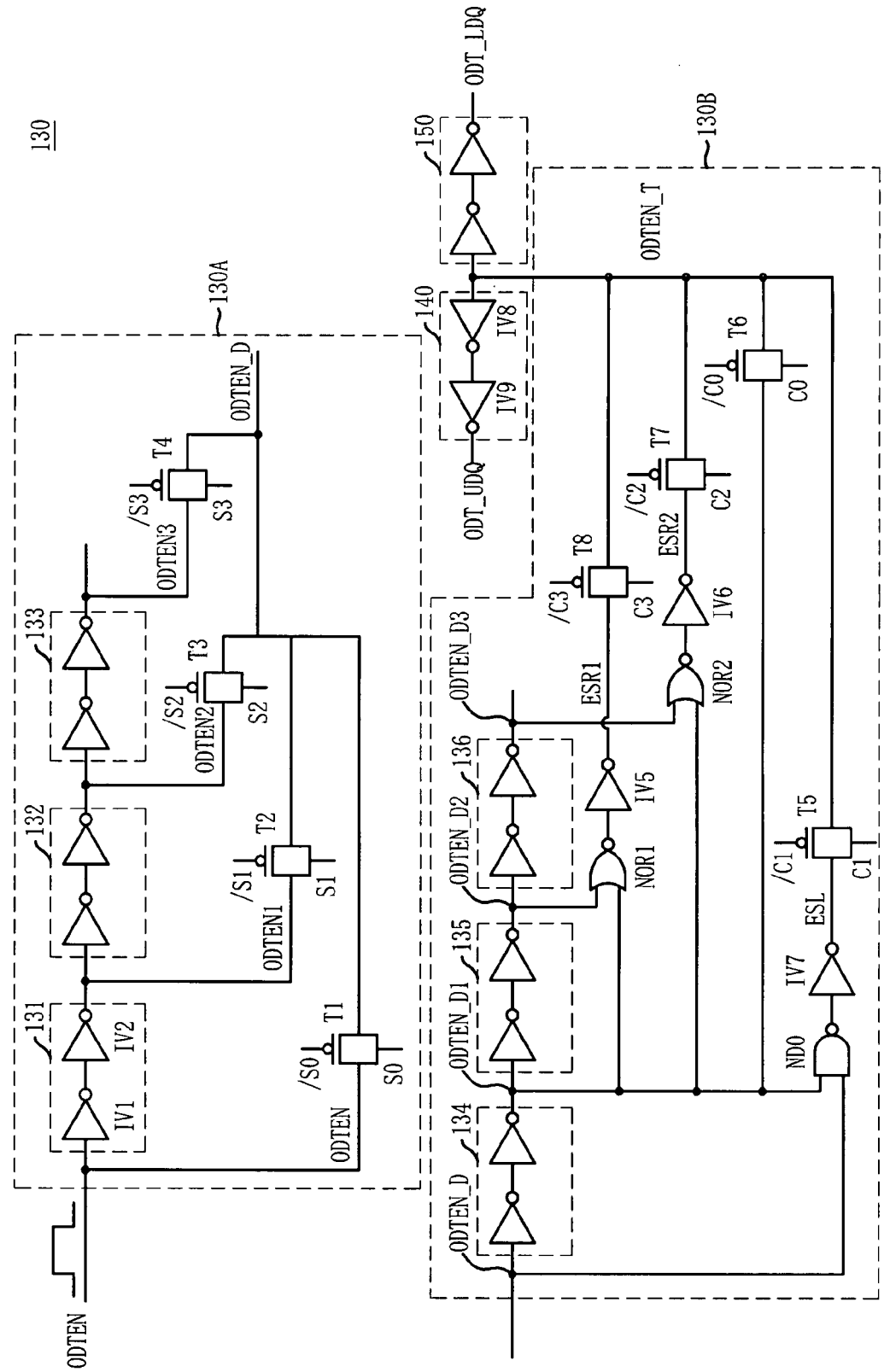
FIG. 8 is a block diagram illustrating the first trimming control unit and the first and second repeaters.

FIG. 8 is a block diagram illustrating the first trimming control unit and the first and second repeaters. Referring to FIG. 8, the first trimming control unit 130 includes a normal ODT signal delay unit 130A to delay the normal ODT driving enable signal DOTEN by a delay value corresponding to the control signals S0 to S3 and /S0 to /S3 and a normal pulse width adjusting unit 130B to change a pulse width of the delayed ODT driving enable signal DOTEN_D outputted from the normal ODT signal delay unit 130A. Particularly, the normal pulse width adjusting unit 130B is characterized by change a transition timing for inactivating the delayed ODT driving enable signal DOTEN_D. Since the activation of the delayed ODT driving enable signal DOTEN_D is in a low level, the change of the transition timing for inactivating the delayed ODT driving enable signal DOTEN_D means the change of a transition timing to the low level.

The normal ODT signal delay unit 130A includes: a plurality of delay elements 131 to 133, which are in parallel connected to each other, to delay the normal ODT driving enable signal DOTEN; a plurality of transfer gates T2 to T4, which are respectively correspondent to the plurality of delay elements 131 to 133, to selectively output an output signal of the corresponding delay element; and a transfer gate T1 to selectively transfer the normal ODT driving enable signal DOTEN to an output terminal.

The normal pulse width adjusting unit 130B includes: a plurality of delay elements 134 to 136, which are in series connected to each other, to delay the delayed normal ODT driving enable signal DOTEN_D from the normal ODT signal delay unit 130A; a NAND gate ND0 connected to input and output terminals of the delay element 134 selected from the plurality of delay elements 134 to 136; an inverter IV7 to invert an output signal of the NAND gate ND0; a NOR gate NOR1 connected to input and output terminals of the delay element 135 selected from the plurality of delay elements 134 to 136; an inverter IV5 to invert an output signal of the NOR gate NOR1; a NOR gate NOR2 connected to input and output terminals of a delay group in which at least two delay elements of the plurality of delay elements 134 to 136 are selected; an inverter IV6 to invert an output signal of the NOR gate NOR2; a transfer gate T5 to selectively output an output signal of the inverter IV7 for producing the trimmed ODT driving enable signal DOTEN_T; a transfer gate T7 to selectively output an output signal of the inverter IV6 for producing the trimmed ODT driving enable signal DOTEN_T; a transfer gate T8 to selectively output an output signal of the inverter IV5 for producing the trimmed ODT driving enable signal DOTEN_T; and a transfer gate T6 to produce the trimmed ODT driving enable signal DOTEN_T to an output terminal by selectively outputting an output signal of the delay element 134.

Since the second trimming control unit 230 is the same as the first trimming control unit 1230, except for the change of the waveform of the write ODT driving enable signal ODT-WEN inputted thereinto, the detailed description will be omitted The first repeater 140 has two serial-connected inverters IV9 and IV8 and the second repeater 150 also has the same configuration.

When the normal ODT driving enable signal ODTEN which is synchronized by the delay locked loop is inputted into the normal ODT signal delay unit 130A, the inputted normal ODT driving enable signal ODTEN is delayed by the serial-connected delay elements 131 to 133 in order. The normal ODT driving enable signal ODTEN passing through the first delay element 131 forms a first delay signal ODTEN1, the normal ODT driving enable signal ODTEN passing through the first delay elements 131 and 132 forms a second delay signal ODTEN2, and the normal ODT driving enable signal ODTEN passing through the first delay elements 131, 132 and 133 forms a third delay signal ODTEN3. The turn-on gate of the transfer gates T1 to T4 is determined by the control signals S0 to S3 and /S0 to /S3 and the signal transferred by the turn-on gate forms the delayed normal ODT driving enable signal ODTEN_D. Amounts of the delay in the delay elements 131 to 133 may be all the same or different from each other. The number of the delay elements in the normal ODT signal delay unit 130A can be modified based on the characteristics of the semiconductor memory devices.

The delayed normal ODT driving enable signal ODTEN_D is successively delayed by the serial-connected delay elements 134 to 136 which are equipped in the normal pulse width adjusting unit 130B. The normal ODT driving enable signal ODTEN passing through the first delay element 134 forms a fourth delay signal ODTEN_D1, the normal ODT driving enable signal ODTEN passing through the first delay elements 134 and 135 forms a fifth delay signal ODTEN_D2, and the normal ODT driving enable signal ODTEN passing through the first delay elements 134 to 136 forms a sixth delay signal ODTEN_D3.

Subsequently, the NAND gate NO0 and the inverter IV7 performs the logic AND operation on the input and output signals of the delay element 134 and transfers the result to the transfer gate T5. The output signal of the delay element 134 is transferred to the transfer gate T6. The NOR gate NOR2 and the inverter IV6 performs the logic OR operation on the input signal of the delay element 135 and the output signal of the delay element 136 and transfers the result to the transfer gate T7. The NOR gate NOR1 and the inverter IV5 performs the logic OR operation on the input and output signals of the delay element 135 and transfers the result to the transfer gate T8. The turn-on gate of the transfer gates T5 to T8 is determined according to the control signal C0 to C3 and /C0 to /C3, the signals which are transferred by the turn-on gates may become the trimmed normal ODT driving enable signal ODTEN_T. Amounts of the delay in the delay elements 134 to 136 may be all the same or different from each other. The number of the delay elements the normal waveform width ODT signal delay unit 130B can be modified based on the characteristics of the semiconductor memory devices. Also, the method for forming the input signal of the transfer gates T5 to T8 can be implemented by different logic operations.

In conclusion, the normal ODT delay unit 130A delays the input signal by a delay value which is correspondent to the control signal and outputs the delayed output signals and the normal waveform width ODT signal delay unit 130B controls the waveform width of the input signal, that is, the window.

In the present invention, the trimming control unit is classified into according to two parts. One part delays the wave with the various values and the other part controls the width of a waveform. However, the waveform of the signals, which are delayed by the latency for the ODT operation, can be modified into the various cases.

Figure 9:
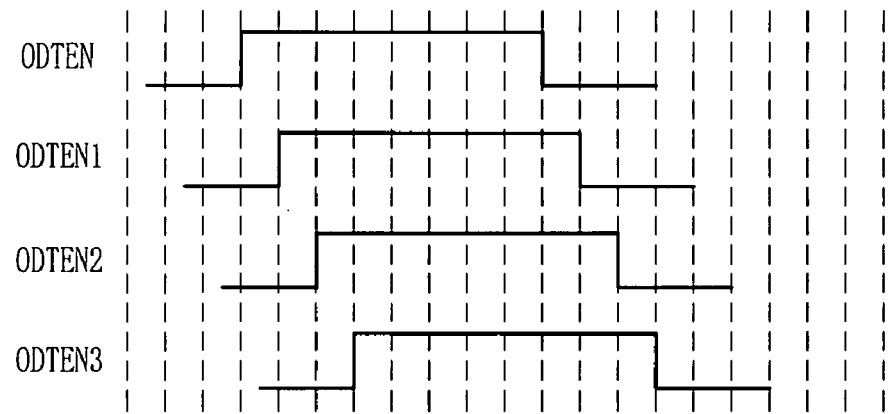
FIG. 9, is a waveform showing the operation of the ODT signal delay unit of FIG. 8.
Figure 10:
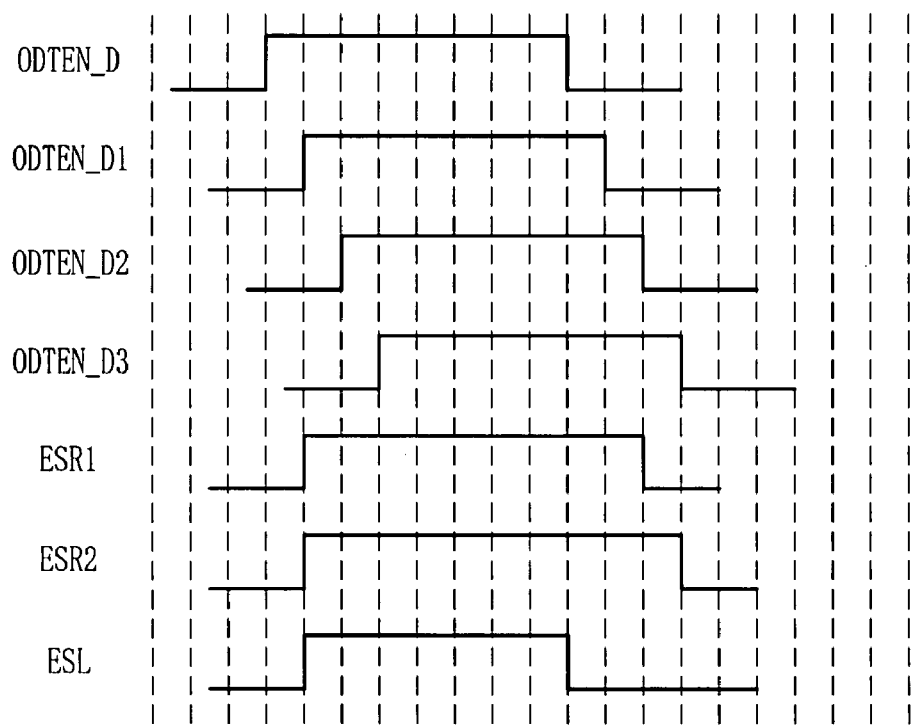
FIG. 10 is a waveform showing the operation of the waveform control unit of FIG. 8.

FIG. 9 is a waveform showing the operation of the ODT signal delay unit of FIG. 8. FIG. 10 is a waveform showing the operation of the waveform control unit of FIG. 8. The waveform of the signal which is delayed in the normal ODT delay unit 130A is shown in FIG. 9 and the waveform of the signal which is controlled by the normal pulse width adjusting unit 130B is shown in FIG. 10.

As described above, since the ODT driving enable signal is delayed by the latency for the ODT operation, and the waveform of the signal is transformed by the trimming control unit, and it is transferred to the termination resistance region, the ODT operation can be operated with the various timing.

Therefore, the present invention can control the different ODT operations of the high-speed semiconductor memory device and further make different tests of the semiconductor memory device. Moreover, an error caused by the timing of the ODT operation can be easily found out.

As apparent from the present invention, the various tests of the ODT operation mode are easily implemented after manufacturing the semiconductor memory devices. Therefore, even though the semiconductor memory device has a condition which is different from that to be predetermined by a designer due to the external environment, the error caused by the ODT operation can be easily found and preferably the ODT operation timing can be adjusted due to that.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a latency control unit for producing an on die termination (ODT) driving enable signal by delaying an ODT operation signal from an external circuit during a predetermined latency;
   a control signal generating unit for producing control signals to control a change of waveform of the ODT driving enable signal;
   a trimming control unit for changing the waveform of the ODT driving enable signal in response to the control signals, thereby outputting a ODT driving signal; and
   a termination circuit for connecting a termination resistance to an impedance adjusting node in response to the ODT driving signal.

2. The semiconductor memory device of claim 1, wherein the trimming control unit includes:
   an ODT signal delay unit for delaying the ODT driving enable signal by an amount of delay which is correspondent to the control signals; and
   a pulse width adjusting unit for changing a pulse width of the delayed ODT driving enable signal from the ODT signal delay unit.

3. The semiconductor memory device of claim 2, wherein the pulse width adjusting unit changes a transition timing for an inactivation of the ODT driving enable signal.

4. The semiconductor memory device of claim 3, wherein the ODT signal delay unit includes:
   a plurality of first delay elements, which are in series connected to each other, for delaying the ODT driving enable signal;
   a plurality of first transfer gates, which are correspondent to the plurality of first delay elements respectively, for selectively outputting an output of the correspondent first delay element to a first output terminal; and
   a second transfer gate for selectively transferring the ODT driving enable signal to the first output terminal.

5. The semiconductor memory device of claim 4, wherein the pulse width adjusting unit includes:
   a plurality of second delay elements, which are in series connected to each other, for delaying the delayed ODT driving enable signal from the ODT signal delay unit;
   a NAND gate connected to input and output terminals of an element selected from the plurality of second delay elements;
   a first NOR gate connected to input and output terminals of an element selected from the plurality of second delay elements;
   a second NOR gate connected to input and output terminals of a delay group in which at least two delay elements in series of the plurality of second delay elements are selected;
   a third transfer gate for selectively outputting an output signal of the NAND gate to a second output terminal;
   a fourth transfer gate for selectively outputting an output signal of the first NOR gate to the second output terminal;
   a fifth transfer gate for selectively outputting an output signal of the second NOR gate to the second output terminal; and
   a sixth transfer gate for selectively outputting an output signal of an element selected from the plurality of second delay elements to the second output terminal.

6. The semiconductor memory device of claim 1, wherein the control signal generating unit further includes:
   a test mode control unit for outputting a plurality of test mode signals in response to at least one test signal which is inputted in a test mode; and
   a decoding unit for decoding the plurality of the test mode signals, thereby outputting the plurality of the control signals.

7. The semiconductor memory device of claim 6, wherein the decoding unit includes a plurality of AND gates each of which receives two signals of the plurality of the test mode signals and inverted signals thereof and outputs one of the plurality of the control signals.

8. The semiconductor memory device of claim 1, further comprising a repeater between the termination circuit and the trimming control unit, wherein the repeater compensates for attenuation of a signal while the ODT driving signal from the trimming control unit is transferred to the termination circuit.

9. The semiconductor memory device of claim 1, further comprising a delay locked loop to produce a delay-locked clock signal wherein the ODT driving enable signal from the latency control unit is outputted in synchronization with the delay-locked clock signal.

10. A semiconductor memory device comprising:
    a first latency control unit for producing a normal ODT driving enable signal by delaying an ODT operation signal from an external circuit during a first latency;
    a second latency control unit for producing a write ODT driving enable signal by delaying a write command signal, which is produced in response to a write command, during a second latency;
    a control signal generating unit for producing control signals to control a change of waveform of the ODT driving enable signal;
    a first trimming control unit for changing the waveform of the normal ODT driving enable signal in response to the control signals, thereby outputting a normal ODT driving signal;
    a second trimming control unit for changing the waveform of the write ODT driving enable signal in response to the control signals, thereby outputting a write ODT driving signal; and a termination circuit for connecting a normal termination resistance to an impedance adjusting node in response to the normal ODT driving signal and for disconnecting the normal termination resistance from the impedance adjusting node and connecting a write termination resistance to the impedance adjusting node in response to the write ODT driving signal.

11. The semiconductor memory device of claim 10, wherein the first trimming control unit includes:
a normal ODT signal delay unit for delaying the normal ODT driving enable signal by an amount of delay which is correspondent to the control signals; and
a normal pulse width adjusting unit for changing a pulse width of the delayed normal ODT driving enable signal from the normal ODT signal delay unit.

12. The semiconductor memory device of claim 11, wherein the normal pulse width adjusting unit changes a transition timing for an inactivation of the normal ODT driving enable signal.

13. The semiconductor memory device of claim 12, wherein the second trimming control unit includes:
a write ODT signal delay unit for delaying the write ODT driving enable signal by an amount of delay which is correspondent to the control signals; and
a write pulse width adjusting unit for changing a pulse width of the delayed write ODT driving enable signal from the write ODT signal delay unit.

14. The semiconductor memory device of claim 13, wherein the normal ODT signal delay unit includes:
a plurality of first delay elements, which are in series connected to each other, for delaying the normal ODT driving enable signal;
a plurality of first transfer gates, which are correspondent to the plurality of first delay elements respectively, for selectively outputting an output of the correspondent first delay element to a first output terminal; and
a second transfer gate for selectively transferring the normal ODT driving enable signal to the first output terminal.

15. The semiconductor memory device of claim 14, wherein the normal pulse width adjusting unit includes:
a plurality of second delay elements, which are in series connected to each other, for delaying the delayed normal ODT driving enable signal from the normal ODT signal delay unit;
a NAND gate connected to input and output terminals of an element selected from the plurality of second delay elements;
a first NOR gate connected to input and output terminals of an element selected from the plurality of second delay elements;
a second NOR gate connected to input and output terminals of a delay group in which at least two delay elements in series of the plurality of second delay elements are selected;
a third transfer gate for selectively outputting an output signal of the NAND gate to a second output terminal;
a fourth transfer gate for selectively outputting an output signal of the first NOR gate to the second output terminal;
a fifth transfer gate for selectively outputting an output signal of the second NOR gate to the second output terminal; and
a sixth transfer gate for selectively outputting an output signal of an element selected from the plurality of second delay elements to the second output terminal.

16. The semiconductor memory device of claim 10, wherein the control signal generating unit further includes:
a test mode control unit for outputting a plurality of test mode signals in response to at least one test signal which is inputted in a test mode; and
a decoding unit for decoding the plurality of the test mode signals, thereby outputting the plurality of the control signals.

17. The semiconductor memory device of claim 16, wherein the decoding unit includes a plurality of AND gates each of which receives two signals of the plurality of the test mode signals and inverted signals thereof and outputs one of the plurality of the control signals.

18. The semiconductor memory device of claim 10, further comprising repeaters between the termination circuit and the first or second trimming control unit, wherein the repeaters compensate for attenuation of a signal while the normal and write ODT driving signals from the first and second trimming control units are transferred to the termination circuit, respectively.

19. The semiconductor memory device of claim 10, further comprising a delay locked loop to produce a delay-locked clock signal wherein the normal and write ODT driving enable signals from the first and second latency control units are respectively outputted in synchronization with the delay-locked clock signal.

20. A semiconductor memory device comprising:
a latency control unit for producing an ODT driving enable signal by delaying an ODT operation signal from an external circuit during a predetermined latency;
an ODT signal delay unit for delaying the ODT driving enable signal by an amount of delay which is correspondent to control signals;
a pulse width adjusting unit for changing waveform of the delayed ODT driving enable signal from the ODT signal delay unit, thereby outputting the ODT driving signal; and
a termination circuit for connecting a termination resistance to an impedance adjusting node in response to the ODT driving signal.

21. The semiconductor memory device of claim 20, wherein the pulse width adjusting unit changes a transition timing for an inactivation of the ODT driving enable signal.

22. The semiconductor memory device of claim 21, wherein the ODT signal delay unit includes:
a plurality of first delay elements, which are in series connected to each other, for delaying the ODT driving enable signal;
a plurality of first transfer gates, which are correspondent to the plurality of first delay elements respectively, for selectively outputting an output of the correspondent first delay element to a first output terminal; and
a second transfer gate for selectively transferring the ODT driving enable signal to the first output terminal.

23. The semiconductor memory device of claim 22, wherein the pulse width adjusting unit includes:
a plurality of second delay elements, which are in series connected to each other, for delaying the delayed ODT driving enable signal from the ODT signal delay unit;
a NAND gate connected to input and output terminals of an element selected from the plurality of second delay elements;
a first NOR gate connected to input and output terminals of an element selected from the plurality of second delay elements;

a second NOR gate connected to input and output terminals of a delay group in which at least two delay elements in series of the plurality of second delay elements are selected;
a third transfer gate for selectively outputting an output signal of the NAND gate to a second output terminal;
a fourth transfer gate for selectively outputting an output signal of the first NOR gate to the second output terminal;
a fifth transfer gate for selectively outputting an output signal of the second NOR gate to the second output terminal; and
a sixth transfer gate for selectively outputting an output signal of an element selected from the plurality of second delay elements to the second output terminal.

24. The semiconductor memory device of claim 20, further including:
a test mode control unit for outputting a plurality of test mode signals in response to at least one test signal which is inputted in a test mode; and
a decoding unit for decoding the plurality of the test mode signals, thereby outputting the plurality of the control signals.

25. The semiconductor memory device of claim 24, wherein the decoding unit includes a plurality of AND gates each of which receives two signals of the plurality of the test mode signals and inverted signals thereof and outputs one of the plurality of the control signals.

26. The semiconductor memory device of claim 20, further including a repeater between the termination circuit and the pulse width adjusting unit, wherein the repeater compensates for attenuation of a signal while the ODT driving signal from the pulse width adjusting unit is transferred to the termination circuit.

27. The semiconductor memory device of claim 20, further including a delay locked loop to produce a delay-locked clock signal wherein the ODT driving enable signal from the latency control unit is outputted in synchronization with the delay-locked clock signal.

28. A semiconductor memory device comprising:
a first latency control unit for producing a normal ODT driving enable signal by delaying an ODT operation signal from an external circuit during a first latency;
a second latency control unit for producing a write ODT driving enable signal by delaying a write command signal, which is produced in response to a write command, during a second latency;
a normal ODT signal delay unit for delaying the normal ODT driving enable signal by an amount of delay which is correspondent to control signals;
a normal pulse width adjusting unit for changing a pulse width of the delayed normal ODT driving enable signal from the normal ODT signal delay unit, thereby outputting a normal ODT driving signal;
a write ODT signal delay unit for delaying the write ODT driving enable signal by an amount of delay which is correspondent to control signals;
a write pulse width adjusting unit for chanting a pulse width of the delayed write ODT driving enable signal from the write ODT signal delay unit, thereby outputting a write ODT driving signal; and
a termination circuit for connecting a normal termination resistance to an impedance adjusting node in response to the normal ODT driving signal and for disconnecting the normal termination resistance from the impedance adjusting node and connecting a write termination resistance to the impedance adjusting node in response to the write ODT driving signal.

29. The semiconductor memory device of claim 28, wherein the normal pulse width adjusting unit changes a transition timing for an inactivation of the normal ODT driving enable signal.

30. The semiconductor memory device of claim 29, wherein the normal ODT signal delay unit includes:
a plurality of first delay elements, which are in series connected to each other, for delaying the normal ODT driving enable signal;
a plurality of first transfer gates, which are correspondent to the plurality of first delay elements respectively, for selectively outputting an output of the correspondent first delay element to a first output terminal; and
a second transfer gate for selectively transferring the normal ODT driving enable signal to the first output terminal.

31. The semiconductor memory device of claim 30, wherein the normal pulse width adjusting unit includes:
a plurality of second delay elements, which are in series connected to each other, for delaying the delayed normal ODT driving enable signal from the normal ODT signal delay unit;
a NAND gate connected to input and output terminals of an element selected from the plurality of second delay elements;
a first NOR gate connected to input and output terminals of an element selected from the plurality of second delay elements;
a second NOR gate connected to input and output terminals of a delay group in which at least two delay elements in series of the plurality of second delay elements are selected;
a third transfer gate for selectively outputting an output signal of the NAND gate to a second output terminal;
a fourth transfer gate for selectively outputting an output signal of the first NOR gate to the second output terminal;
a fifth transfer gate for selectively outputting an output signal of the second NOR gate to the second output terminal; and
a sixth transfer gate for selectively outputting an output signal of an element selected from the plurality of second delay elements to the second output terminal.

32. The semiconductor memory device of claim 28, further including:
a test mode control unit for outputting a plurality of test mode signals in response to at least one test signal which is inputted in a test mode; and
a decoding unit for decoding the plurality of the test mode signals, thereby outputting the plurality of the control signals.

33. The semiconductor memory device of claim 32, wherein the decoding unit includes a plurality of AND gates each of which receives two signals of the plurality of the test mode signals and inverted signals thereof and outputs one of the plurality of the control signals.

34. The semiconductor memory device of claim 28, further including repeaters between the termination circuit and the normal or write pulse width adjusting unit, wherein the repeaters compensate for attenuation of a signal while the normal and write ODT driving signals from the normal and write pulse width adjusting units are transferred to the termination circuit, respectively.

35. The semiconductor memory device of claim 28, further including a delay locked loop to produce a delay-locked clock signal wherein the normal and write ODT driving enable signals from the first and second latency control units are respectively outputted in synchronization with the delay-locked clock signal.

36. A method for driving a semiconductor-memory device comprising:
producing an ODT driving enable signal by delaying an ODT operation signal from an external circuit during a predetermined latency;
producing control signals to control a change of waveform of the ODT driving enable signal;
changing the waveform of the ODT driving enable signal in response to the control signals, thereby outputting a ODT driving signal; and
connecting a termination resistance to an impedance adjusting node in response to the ODT driving signal.

37. The method of claim 36, wherein the changing the waveform of the ODT driving enable signal includes:
delaying the ODT driving enable signal by an amount of delay which is correspondent to the control signals; and
changing a pulse width of the delayed ODT driving enable signal.

38. The method of claim 37, wherein the changing a pulse width of the delayed ODT driving enable signal changes a transition timing for an inactivation of the ODT driving enable signal.

39. The method of claim 38, further comprising compensating for a distortion of the ODT driving signal using a repeater.

40. The method of claim 36, further comprising:
outputting a plurality of test mode signals in response to at least one test signal which is inputted in a test mode; and
decoding the plurality of the test mode signals and outputting the plurality of the control signals.

41. The method of claim 36, wherein the ODT driving enable signal, which is delayed for the latency, is outputted in synchronization with a delay-locked clock signal.

42. A method for driving a semiconductor memory device comprising:
producing a normal ODT driving enable signal by delaying an ODT operation signal from an external circuit during a first latency;
producing a write ODT driving enable signal by delaying a write command signal, which is produced in response to a write command, during a second latency;
producing control signals to control a change of waveform of the ODT driving enable signal;
changing the waveform of the normal ODT driving enable signal in response to the control signals, thereby outputting a normal ODT driving signal;
changing the waveform of the write ODT driving enable signal in response to the control signals, thereby outputting a write ODT driving signal;
connecting a normal termination resistance to an impedance adjusting node in response to the normal ODT driving signal; and
disconnecting the normal termination resistance from the impedance adjusting node and connecting a write termination resistance to the impedance adjusting node in response to the write ODT driving signal.

43. The method of claim 42, wherein the changing the waveform of the normal ODT driving enable signal includes:
delaying the normal ODT driving enable signal by an amount of delay which is correspondent to the control signals; and
changing a pulse width of the delayed normal ODT driving enable signal.

44. The method of claim 43, wherein the changing a pulse width of the delayed normal ODT driving enable signal changes a transition timing for an inactivation of the normal ODT driving enable signal.

45. The semiconductor memory device of claim 42, further comprising:
outputting a plurality of test mode signals in response to at least one test signal which is inputted in a test mode; and
decoding the plurality of the test mode signals and outputting the plurality of the control signals.

46. The method of claim 42, further comprising compensating for a distortion of the normal ODT driving signal using a repeater.

47. The method of claim 42, wherein the normal and write ODT driving enable signals, which are delayed for the first latency and the second latency, respectively, are outputted in synchronization with a delay-locked clock signal.

* * * * *